United States Patent
Britton, Jr. et al.

(10) Patent No.: US 7,187,236 B2
(45) Date of Patent: Mar. 6, 2007

(54) RAIL-TO-RAIL DIFFERENTIAL INPUT AMPLIFICATION STAGE WITH MAIN AND SURROGATE DIFFERENTIAL PAIRS

(75) Inventors: Charles Lanier Britton, Jr., Alcoa, TN (US); Stephen Fulton Smith, Loudon, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 22 days.

(21) Appl. No.: 10/935,525

(22) Filed: Sep. 7, 2004

(65) Prior Publication Data
US 2006/0049873 A1    Mar. 9, 2006

(51) Int. Cl.
*H03F 3/04* (2006.01)

(52) U.S. Cl. .................. 330/258; 330/69; 330/260; 330/311; 330/291; 330/124 R; 327/560; 327/563; 327/594

(58) Field of Classification Search ............ 330/258.69, 330/260, 311, 291, 292, 295, 124 R, 124 D, 330/147; 327/560, 563, 594
See application file for complete search history.

(56) References Cited

U.S. PATENT DOCUMENTS 5,006,817 A    4/1991    Babanezhad et al.
5,550,510 A    8/1996    Nagaraj
5,631,607 A    5/1997    Huijsing et al.
5,734,297 A    3/1998    Huijsing et al.
5,745,007 A    4/1998    Redman-White
5,986,502 A *  11/1999   Nakamura .................. 330/258
6,825,721 B2 * 11/2004   Sanchez et al. ............. 330/253

OTHER PUBLICATIONS

Ribner, et al., IEEE Journal of Solid State Circuits, 1984, pp. 919-925, vol. SC-19, No. 6.
Wang, et al., IEEE Journal of Solid State Circuits, 1999, pp. 148-156, vol. 34, No. 2.
Duque-Carrillo, et al., IEEE Journal of Solid State Circuits, 2000, pp. 33-43, vol. 35, No. 1.

* cited by examiner

*Primary Examiner*—Michael B. Shingleton
(74) *Attorney, Agent, or Firm*—Akerman Senterfitt; Neil R. Jetter

(57) ABSTRACT

An operational amplifier input stage provides a symmetrical rail-to-rail input common-mode voltage without turning off either pair of complementary differential input transistors. Secondary, or surrogate, transistor pairs assume the function of the complementary differential transistors. The circuit also maintains essentially constant transconductance, constant slew rate, and constant signal-path supply current as it provides rail-to-rail operation.

19 Claims, 2 Drawing Sheets

RAIL-TO-RAIL DIFFERENTIAL INPUT AMPLIFICATION STAGE WITH MAIN AND SURROGATE DIFFERENTIAL PAIRS

STATEMENT REGARDING FEDERALLY SPONSORED RESEARCH OR DEVELOPMENT

The United States Government has rights in this invention pursuant to Contract No. DE-AC05-00OR22725 between the United States Department of Energy and UT-Battelle, LLC.

BACKGROUND OF THE INVENTION

1. Field of Invention

The invention relates to operational amplifier input stages having essentially constant transconductance and slew rate. More particularly, it relates to an input stage that incorporates a secondary, or surrogate, differential pair of transistors that remain off during normal midrange operation but gradually replace the main differential pair of transistors when the common-mode voltage approaches the supply rails.

2. Description of Prior Art

Operational amplifiers used in low-voltage CMOS integrated-circuit processes normally require a differential input stage that can operate properly even when the common-mode voltages are near the supply rails. This is because when the common-mode input voltages are near the supply rails, they cause changes in internal bias points. This, in turn, can lead to degradation in performance of the input pair and consequently the entire amplifier.

In the past, a number of differential input stage circuits have been developed to deal with and overcome the common-mode voltage problem. Most of these circuits are based on the use of a p-channel and an n-channel complementary differential pair of transistors. Some examples follow.

Ribner, D. B. et al, IEEE Journal of Solid State Circuits, Vol. SC-19, No. 6, December 1984, pp. 919–925 describes an early technique for improving the high-frequency power-supply rejection and wide common-mode input voltage range of an operational amplifier input stage via a folded-cascode stage with internal frequency compensation and current-mirror biasing stages to produce a current-folding effect. The circuit acts to turn off an input stage that has gone toward the negative-rail to a moderate extent.

Babanezhad, J. N. et al, U.S. Pat. No. 5,006,817, issued Apr. 9, 1991 describes a CMOS operational amplifier configuration with an output stage that can swing rail-to-rail for a given amount of current. The output transistors can thus be made smaller in size while still maintaining high linear output drive capability.

Nagaraj, H., U.S. Pat. No. 5,550,510, issued Aug. 27, 1996 describes a differential amplifier having two complementary differential pairs connected for rail-to-rail common-mode input voltage range operation. A constant transconductance maintaining bias circuit is also included.

Huijsing, J. H. et al, U.S. Pat. No. 5,631,607, issued May 20, 1997 describes a transconductance control circuit in which a floating voltage source is added between complementary differential input pairs of transistors. The floating voltage source maintains the sum of the gate-source voltages of the input pairs, and therefore keeps the transconductance constant.

Huijsing, J. H. et al, U.S. Pat. No. 5,734,297, issued Mar. 31, 1998 describes a rail-to-rail input stage with constant transconductance and constant common-mode output currents. A current switch is coupled to each of the input pairs of transistors and to a voltage source.

Redman-White, W., U.S. Pat. No. 5,745,007, issued Apr. 28, 1998 describes a CMOS amplifier with a differential input which is fed to six differential pairs. The circuit operates such that regardless of the common-mode input level with respect to the supply rails, four transistors provide an output current that gives a constant transconductance and slew rate.

Wang, M. et al, IEEE Journal of Solid State Circuits, Vol. 34, No. 2, February 1999, pp. 148–156 describes a method for overlapping the transition regions of the tail currents of complementary differential n- and p-input transistor pairs to achieve constant overall transconductance.

Duque-Carrillo, J. F. et al, IEEE Journal of Solid State Circuits, Vol. 35, No. 1, January 2000, pp. 33–43 describes two rail-to-rail operational amplifier circuits for very low supply voltage operation in standard CMOS technology. The first is based on an amplifier input stage having complementary differential pairs, and it incorporates a dynamic level-shifting technique to extend the amplifier's input range up to the rails. The second circuit is an input stage based on a single differential input pair.

Our invention, like many of the prior circuits, uses main n-channel and main p-channel complementary differential pairs of transistors. Unlike any of the prior approaches, however, we incorporate a secondary complementary pair of transistors that act as a surrogate transistor pair to take over the function of the main n-channel pair under the low common-mode voltage condition. In like manner, we employ a secondary complementary pair of transistors to assume the function of the main p-channel pair under the high common-mode voltage condition.

BRIEF SUMMARY OF THE INVENTION

It is a first object of the invention to provide an operational amplifier input stage that maintains essentially constant transconductance and bias through the use of a surrogate, or secondary, n-channel differential input pair of transistors that assumes the function of the main n-channel pair as the main n-channel pair turns off during the low common-mode voltage condition.

It is another object of the invention to provide an operational amplifier input stage that maintains essentially constant transconductance and bias through the use of a surrogate, or secondary; p-channel differential input pair of transistors that assumes the function of the main p-channel pair as the main p-channel pair turns off during the high common-mode voltage condition.

It is a further object of the invention to provide a fully complementary operational amplifier input stage that maintains essentially constant transconductance and bias through the use of surrogate, or secondary, n- and p-channel differential input pairs that assume the function of the main n- and p-channel pairs as they turn off during low and high common-mode voltage conditions, respectively.

It is another object of the invention to provide surrogate n- and p-channel differential input pairs having level shifters and cascade-stage isolation of the surrogate pairs.

In a first preferred embodiment, the invention is an essentially constant transconductance, constant slew rate, noncomplementary rail-to-rail differential input amplification stage having a common-mode input voltage range including low, mid, and high range. It uses a main input differential pair of transistors receiving input signal voltages from an external source. It employs a surrogate input differential pair of transistors biased with a voltage offset from the main input differential pair of transistors. It also includes a means for controllably isolating the surrogate input differential pair of transistors from the main signal path, a means for sensing the amount of bias current in the main input differential pair of transistors, and a means for providing a controlled amount of bias current to the surrogate input differential pair of transistors.

In another preferred embodiment, the invention is an essentially constant transconductance, constant slew rate, constant signal-path supply-current, fully complementary rail-to-rail differential input amplification stage having a common-mode input voltage range including low, mid and high range. It uses two sets of opposite-polarity input differential pairs of transistors receiving input signal voltages from an external source. It employs two sets of surrogate input differential pairs of transistors biased with voltage offsets from the main input differential pairs of transistors. It includes a means for controllably isolating the surrogate input differential pairs of transistors from the main signal paths, a means for sensing the amounts of bias currents in the main input differential pairs of transistors; and a means for providing controlled amounts of bias currents to the surrogate input differential pairs of transistors.

DETAILED DESCRIPTION OF THE INVENTION

Noncomplementary Rail-to-Rail Differential Input Amplification Stage

Figure 1:
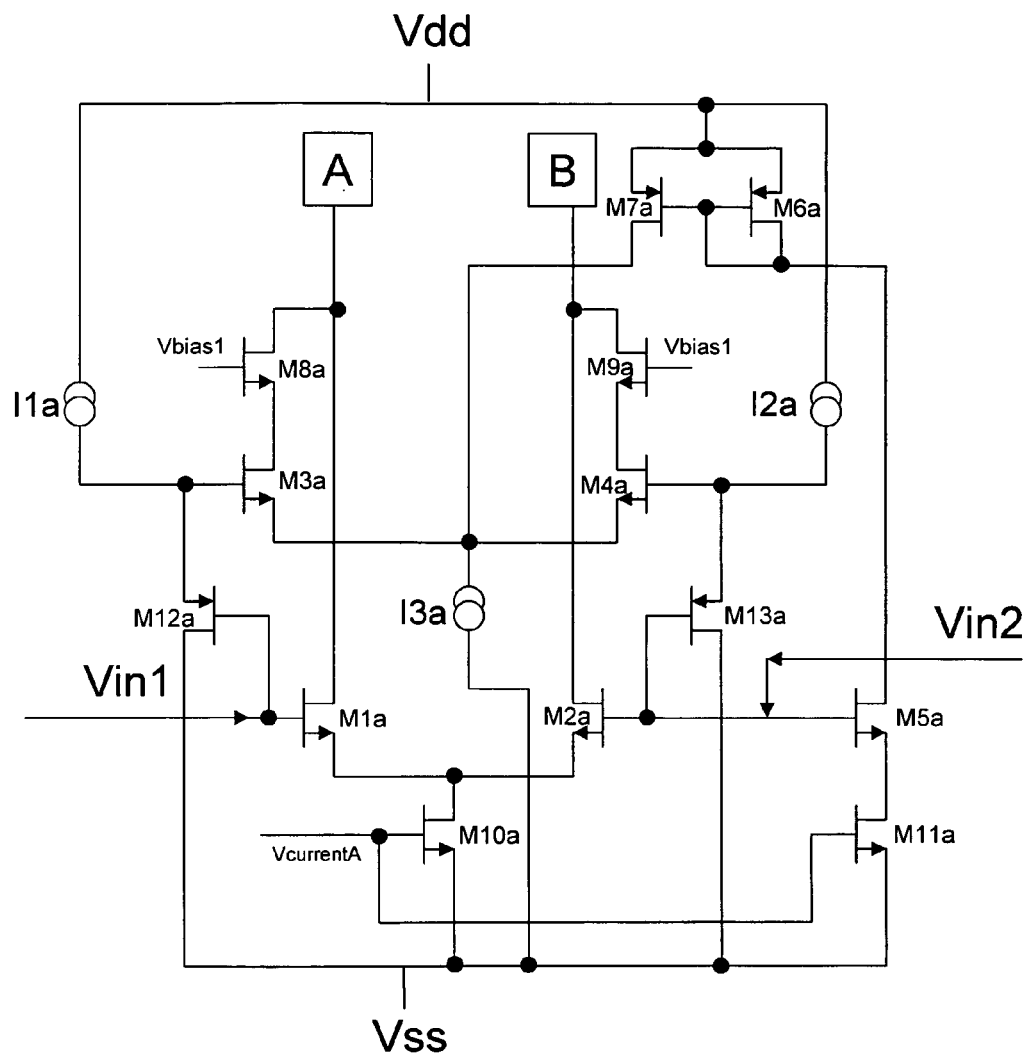
FIG. 1 is a circuit diagram of a preferred noncomplementary rail-to-rail differential input amplification stage of the invention having a pair of surrogate transistors that take over the function of the main differential pair of transistors under low common-mode voltage conditions.

A preferred embodiment of the invention is the noncomplementary rail-to-rail differential input amplification stage shown in FIG. 1. An example using n-channel CMOS devices is described. Because there is only one polarity of transistor in the main amplification path (M1a, M2a, M3a, M4a, M8a, and M9a), we call this a noncomplementary topology. In FIG. 1, Vin1 and Vin2 are the input signal voltages to the stage that come from an independent external source. Points A and B are output terminals that connect to the differential inputs of a subsequent stage.

In FIG. 1, M1a and M2a comprise a standard differential input pair of transistors (main transistors) biased with a current flowing through M10a set by VcurrentA. M3a and M4a are differential surrogate transistors, and M8a and M9a are cascode isolation transistors whose gates are biased with the voltage Vbias1. The cascode isolation transistors M8a and M9a are necessary because for high common-mode input voltages, M3a and M4a can go into the ohmic regime. If M3a and M4a were directly attached to outputs A and B, this would reduce the impedance, and therefore gain, at the outputs A and B.

Transistors M12a and M13a are level shifting transistors for the surrogate transistors M3a and M4a. Transistors M12a and M13a are p-channel source followers that offset the voltage to the inputs of the surrogate differential pair M3a and M4a positive with respect to the inputs Vin1 and Vin2. Current sources I1a and I2a supply current for the biasing of M3a and M4a. For mid- and high-range common-mode voltages, the main transistors M1A and M2A remain active.

Transistors M5a and M11a crack the biasing of the main differential pair M1a and M2a and the current source M10a. Using transistors M6a and M7a as current replicators, or "mirrors", transistors M5a and M11a act as an auxiliary tracking circuit to supply a current proportional to that flowing in M10a. This current is, for mid-range common-mode voltages, equal to that flowing in current source I3a. Current source I3a is designed to have a current equal to that flowing into M10a for midrange common-mode input voltages. Therefore, no net current flows in the surrogate transistors for mid or high range common-mode voltages.

In the low common-mode voltage range, the M10a current source begins to fall out of saturation into the ohmic region, so that it begins to cease to operate as a current source and begins to operate essentially as a resistor. As this happens, the current from M10a is no longer constant, and the main transistors M1a and M2a begin to fail to operate as desired. This occurs at a voltage very close to that of the negative rail. For low common-mode voltages, M1a and M2a will partly or completely turn off due to the partial or complete shutoff of the current source M10a. Transistors M5a and M11a track and replicate this reduced current through M6a and M7a.

The current flowing from M7a therefore changes from a current equal to that flowing in I3a to a current less that that flowing in I3a. The difference between the I3a current and the current flowing in M7a then flows in M3a and M4a. This current is clearly the difference between the mid-range common-mode value of the current in M10a and the value of the current in M10a at a given input common-mode voltage. This ensures that tenet current flowing to the output terminals A and B will be equal for all values of input common-mode voltage.

Effect on Transconductance

The small-signal transconductance between the output terminals A and B of the circuit can be defined as:

$$|gm|=(IoutA-IoutB)/(Vin1-Vin2)$$

where IoutA and IoutB are the circuit output currents at terminals A and B respectively. This value will be approximately equal to the transconductance of either main transistor M1a or M2a, assuming they are identical devices. The transconductance of these transistors varies with the amount of bias current flowing through them. In strong inversion, the transconductance varies as the square root of the current, while in weak inversion, the transconductance varies directly, i.e., linearly, with current. It will be clear that if transistors M1a–M4a are identical, the circuit of FIG. 1 will maintain the sum of the currents in the main transistor M1a and surrogate transistor M3a constant, and it will also maintain the sum of the currents in the main transistor M2a and surrogate transistor M4a constant. The transconductance of the composite stage will therefore be the same for the midrange common-mode voltages (M1a, M2a on and M3a, M4a off) and the low common-mode input voltages (M1a, M2a off and M3a, M4a on), with some variation in the transition between mid and low range common-mode input voltages for transistors biased in strong-inversion mode. For the weak-inversion mode, the transition will result in an essentially constant transconductance. Although the nominal circuit configuration of the invention controls the bias current in the surrogate differential pair based on the bias current level in the main differential pair, other methods of controlling the surrogate pair are also useful, including sensing the input signal voltages or applying a variable or fixed external voltage.

Effect on Slew Rate

If the stage of FIG. 1 is used in an operational amplifier, the slew rate depends on the current available at terminals A and B. Because the biasing maintains a constant bias current at these terminals, the slew rate will be essentially constant for all values of common-mode input voltage between the power supply rails.

P-Channel Example

It will be appreciated that the above description applies equally to an inverted version of the circuit where p-channel main transistor input pairs and p-channel surrogate transistor pairs are used, and where the voltages and current sources are reversed. Such an amplifier circuit would compensate the p-channel main transistors as they turn off in conditions of high common-mode input voltages. This would also be termed a noncomplementary topology.

Fully Complementary Rail-to-Rail Differential Input Amplification Stage

Figure 2:
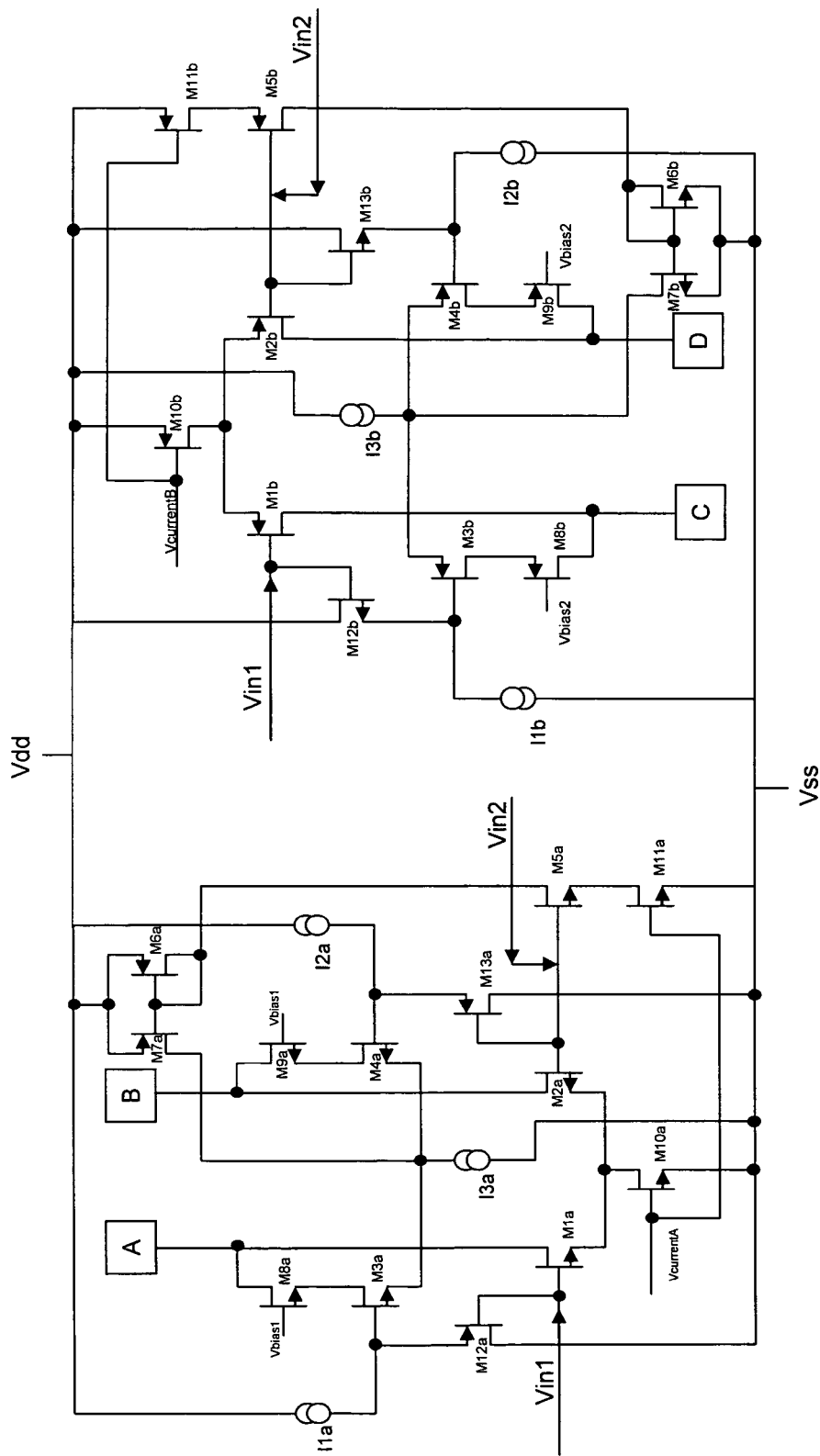
FIG. 2 is a circuit diagram of a preferred fully complementary rail-to-rail differential input amplification stage of the invention having n-channel and p-channel surrogate transistor pairs that take over the function of the main n-channel and p-channel differential pairs of transistors under low and high common-mode voltage conditions, respectively.

A further embodiment of the invention is the fully complementary rail-to-rail differential input amplification stage shown in FIG. 2. In FIG. 2, the two above embodiments are combined in one circuit to result in a fully complementary differential stage that compensates fully for both low and high common-mode input voltage operating conditions. By fully complementary we mean using opposite-polarity device polarities and the resulting mirror image circuit topologies (M1a,b; M2a,b; M3a,b; M4a,b; M8a,b; and M9a,b).

In FIG. 2, the output terminals A and B would be connected to the positive inputs of a subsequent differential stage such as the one described at J. N. Babanezhad et al, U.S. Pat. No. 5,006,817, issued Apr. 9, 1991, for example. Likewise, output terminals C and D would be connected to the negative inputs of the subsequent differential stage.

As in the first embodiment, the nominal circuit configuration of the invention controls the bias current in the surrogate differential pairs based on the bias current level in the main differential pairs. However, as in the first embodiment, other methods of controlling the surrogate pairs are also useful, including sensing the input signal voltages or applying a variable or fixed external voltage.

While the invention has been described for a CMOS topology, the invention is also applicable to all differential input stages where bipolar transistors are used in place of their respective CMOS counterparts.

Although suggested for use in an operational amplifier device or circuit, the aforementioned differential stage circuits may also be employed in other types of common electronic circuit configurations, including but not limited to comparators, analog buffer amplifiers, multipliers, modulators, frequency mixers, analog multipliers, analog gain-controlled amplifiers, analog limiters, analog function generators, sine/cosine generators, voltage-controlled current sources, level translators/shifters, and analog nonlinear signal-processing systems.

The circuits described herein operate linearly with rail-to-rail signal voltages and provide significant improvements in dynamic range, end-to-end linearity, and maximum power output compared with the prior-art implementations. Such advantages are especially useful in low-voltage, low-power applications such as those operating from battery sources. Another distinct advantage of the circuitry of our invention is in the essentially constant supply current drawn by the signal path of the amplifier. This approximately constant total signal path bias current is particularly useful in battery-powered, low-noise, and other low-power system implementations.

While there has been shown and described what are at present considered the preferred embodiments of the invention, it will be obvious to those skilled in the art that various changes and modifications can be prepared therein without departing from the scope of the inventions defined by the appended claims.

The invention claimed is:

1. A differential input amplification stage, comprising:
a main input differential pair of transistors coupled at a first common node having first and second inputs for receiving a first and second input signal from an external source;
a first current source coupled to said first common node, said main input differential pair of transistors biased by current flowing though said first current source, said main input differential pair of transistors coupled via first signal paths to first and second outputs of said amplification stage;
a surrogate input differential pair of transistors coupled at a second common node, said surrogate input differential pair of transistors coupled to said first and second outputs of said amplification stage through second signal paths, said second signal paths independent from said first signal paths;
a second current source coupled to said surrogate differential pair of transistors at said second common node, said surrogate differential pair of transistors biased by said second current source;
a level shifting circuit coupled between a base or gate of said main input differential pair of transistors and a base or gate of said surrogate input differential pair of transistors;
a tracking circuit for sensing and supplying a tracking current, said tracking current being proportional to said current provided by said first current source;
a current mirror for replicating said tracking current to supply a mirror current, said mirror current coupled to said second common node, wherein reductions in said mirror current result in an increase in current flowing in said surrogate differential pair of transistors.

2. The amplification stage of claim 1 wherein said first and second current source are sized to provide a substantially equal current for common mode voltages applied at said inputs of said main differential pair at and above an intermediate common mode voltage, said intermediate common mode voltage being below a positive supply rail voltage.

3. The amplification stage of claim 1 wherein said first and second inputs of said main input differential pair of transistors are directly coupled to said external source.

4. The amplification stage of claim 1 further comprising cascode isolated transistors interposed between drains of each of said surrogate input differential pair of transistors and said first and second outputs of said amplification stage.

5. The amplification stage of claim 1 wherein said level shifting circuit comprises an active circuit element.

6. The amplification stage of claim 1 wherein said active circuit element comprises at least one transistor.

7. The amplification stage of claim 1 wherein said amplification stage is an operational amplifier.

8. The amplification stage of claim 1 wherein said amplification stage is an input stage of an operational amplifier.

9. The amplification stage of claim 1 wherein said amplification stage is part of a comparator.

10. The amplification stage of claim 1 wherein said amplification stage is part of an analog frequency mixer.

11. The amplification stage of claim 1 wherein said amplification stage is part of an analog multiplier.

12. The amplification stage of claim 1 wherein said amplification stage is part of an analog gain-controlled amplifier.

13. The amplification stage of claim 1 wherein said amplification stage is part of an analog limiter.

14. The amplification stage of claim 1 wherein said amplification stage is part of an analog buffer amplifier.

15. The amplification stage of claim 1 wherein said amplification stage is part of an analog function generator.

16. The amplification stage of claim 1 wherein said amplification stage is part of a voltage-controlled current source.

17. The amplification stage of claim 1 wherein said amplification stage is part of a level translator/shifter.

18. The amplification stage of claim 1 wherein said amplification stage is part of an analog nonlinear signal processor.

19. The amplification stage of claim 1, further comprising a first and a second of said differential input amplification stages configured to provide a complementary design, said first and second differential input amplification stages comprising opposite-polarity transistors for said input differential pairs and said surrogate input differential pairs.

* * * * *

UNITED STATES PATENT AND TRADEMARK OFFICE
CERTIFICATE OF CORRECTION

| | | |
|---|---|---|
| PATENT NO. | : 7,187,236 B2 | Page 1 of 1 |
| APPLICATION NO. | : 10/935525 | |
| DATED | : March 6, 2007 | |
| INVENTOR(S) | : Britton et al. | |

It is certified that error appears in the above-identified patent and that said Letters Patent is hereby corrected as shown below:

Column 4, line 10, replace "crack" with --track--.
Column 4, line 10, replace "die" with --the--.
Column 4, line 40, replace "tenet" with --the net--.

Signed and Sealed this

Fifteenth Day of May, 2007

JON W. DUDAS
*Director of the United States Patent and Trademark Office*